(12) United States Patent
Shi et al.

(10) Patent No.: US 8,375,261 B2
(45) Date of Patent: Feb. 12, 2013

(54) SYSTEM AND METHOD OF PUNCTURING PULSES IN A RECEIVER OR TRANSMITTER

(75) Inventors: Jun Shi, San Diego, CA (US); Amal Ekbal, San Diego, CA (US); David Jonathan Julian, San Diego, CA (US); Peter John Black, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1096 days.

(21) Appl. No.: 12/175,137

(22) Filed: Jul. 17, 2008

(65) Prior Publication Data

US 2010/0005371 A1 Jan. 7, 2010

Related U.S. Application Data

(60) Provisional application No. 61/078,648, filed on Jul. 7, 2008.

(51) Int. Cl.
*H04L 1/20* (2006.01)
(52) U.S. Cl. ........................................................ 714/708
(58) Field of Classification Search .................. 714/708
See application file for complete search history.

(56) References Cited

U.S. PATENT DOCUMENTS

| | | | | |
|---|---|---|---|---|
| 3,931,703 A | * | 1/1976 | Scherrer et al. | 368/189 |
| 3,936,762 A | * | 2/1976 | Cox et al. | 327/159 |
| 4,384,361 A | * | 5/1983 | Masaki | 340/7.38 |
| 5,428,820 A | | 6/1995 | Okada et al. | |
| 5,687,169 A | | 11/1997 | Fullerton | |
| 5,764,696 A | | 6/1998 | Barnes et al. | |
| 5,812,081 A | | 9/1998 | Fullerton | |
| 5,832,035 A | | 11/1998 | Fullerton | |
| 5,907,427 A | | 5/1999 | Scalora et al. | |
| 5,910,944 A | | 6/1999 | Callicotte et al. | |
| 5,952,956 A | | 9/1999 | Fullerton | |
| 5,960,031 A | | 9/1999 | Fullerton et al. | |
| 5,963,581 A | | 10/1999 | Fullerton et al. | |
| 5,969,663 A | | 10/1999 | Fullerton et al. | |

(Continued)

FOREIGN PATENT DOCUMENTS

| JP | 5110539 A | 4/1993 |
|---|---|---|
| JP | 2002084213 A | 3/2002 |

(Continued)

OTHER PUBLICATIONS

International Search Report—PCT/US2009/049365—International Search Authority, European Patent Office, Apr. 9, 2009.

(Continued)

*Primary Examiner* — Stephen M Baker
(74) *Attorney, Agent, or Firm* — Dang M. Vo; Paul S. Holdaway

(57) ABSTRACT

An apparatus for data communication that receives a plurality of pulses from a remote communications device, determines a pulse puncturing rate based on the pulses, and punctures or discards subsequent pulses based on the pulse puncturing rate. During intervals when punctured pulses are expected, the apparatus operates in a lower power consumption mode for the purpose of conserving power. In another aspect, a receiving apparatus determines the pulse puncturing rate based on received pulses, and transmits the pulse puncturing rate information to a transmitting apparatus. In response, the transmitting apparatus sends a subset of the pulses it would have transmitted based on the pulse puncturing rate. Because the receiving apparatus receives fewer pulses (e.g., a subset), the receiving apparatus may operate in a lower power consumption mode for longer periods in order to conserve power. Similarly, because the transmitting apparatus sends fewer pulses, it may also operate in a lower power consumption mode for longer periods.

53 Claims, 9 Drawing Sheets

U.S. PATENT DOCUMENTS

| | | | |
|---|---|---|---|
| 5,995,534 A | 11/1999 | Fullerton et al. | |
| 6,031,862 A | 2/2000 | Fullerton et al. | |
| 6,091,374 A | 7/2000 | Barnes | |
| 6,111,536 A | 8/2000 | Richards et al. | |
| 6,115,823 A * | 9/2000 | Velasco et al. | 713/322 |
| 6,133,876 A | 10/2000 | Fullerton et al. | |
| 6,154,871 A | 11/2000 | Claydon et al. | |
| 6,177,903 B1 | 1/2001 | Fullerton et al. | |
| 6,218,979 B1 | 4/2001 | Barnes et al. | |
| 6,292,062 B1 * | 9/2001 | Bourk et al. | 331/46 |
| 6,295,019 B1 | 9/2001 | Richards et al. | |
| 6,297,773 B1 | 10/2001 | Fullerton et al. | |
| 6,300,903 B1 | 10/2001 | Richards et al. | |
| 6,304,623 B1 | 10/2001 | Richards et al. | |
| 6,351,652 B1 | 2/2002 | Finn et al. | |
| 6,354,946 B1 | 3/2002 | Finn | |
| 6,400,307 B2 | 6/2002 | Fullerton et al. | |
| 6,400,329 B1 | 6/2002 | Barnes | |
| 6,421,389 B1 | 7/2002 | Jett et al. | |
| 6,424,688 B1 * | 7/2002 | Tan et al. | 375/354 |
| 6,430,208 B1 | 8/2002 | Fullerton et al. | |
| 6,437,756 B1 | 8/2002 | Schantz | |
| 6,462,701 B1 | 10/2002 | Finn | |
| 6,466,125 B1 | 10/2002 | Richards et al. | |
| 6,469,628 B1 | 10/2002 | Richards et al. | |
| 6,483,461 B1 | 11/2002 | Matheney et al. | |
| 6,489,893 B1 | 12/2002 | Richards et al. | |
| 6,492,904 B2 | 12/2002 | Richards | |
| 6,492,906 B1 | 12/2002 | Richards et al. | |
| 6,501,393 B1 | 12/2002 | Richards et al. | |
| 6,504,483 B1 | 1/2003 | Richards et al. | |
| 6,512,455 B2 | 1/2003 | Finn et al. | |
| 6,512,488 B2 | 1/2003 | Schantz | |
| 6,519,464 B1 | 2/2003 | Santhoff et al. | |
| 6,529,568 B1 | 3/2003 | Richards et al. | |
| 6,538,615 B1 | 3/2003 | Schantz | |
| 6,539,213 B1 | 3/2003 | Richards et al. | |
| 6,549,567 B1 | 4/2003 | Fullerton | |
| 6,552,677 B2 | 4/2003 | Barnes et al. | |
| 6,556,621 B1 | 4/2003 | Richards et al. | |
| 6,560,463 B1 | 5/2003 | Santhoff | |
| 6,571,089 B1 | 5/2003 | Richards et al. | |
| 6,573,857 B2 | 6/2003 | Fullerton et al. | |
| 6,577,691 B2 | 6/2003 | Richards et al. | |
| 6,585,597 B2 | 7/2003 | Finn | |
| 6,593,886 B2 | 7/2003 | Schantz | |
| 6,606,051 B1 | 8/2003 | Fullerton et al. | |
| 6,611,234 B2 | 8/2003 | Fullerton et al. | |
| 6,614,384 B2 | 9/2003 | Hall et al. | |
| 6,621,462 B2 | 9/2003 | Barnes | |
| 6,636,566 B1 | 10/2003 | Roberts et al. | |
| 6,636,567 B1 | 10/2003 | Roberts et al. | |
| 6,636,573 B2 | 10/2003 | Richards et al. | |
| 6,642,903 B2 | 11/2003 | Schantz | |
| 6,661,342 B2 | 12/2003 | Hall et al. | |
| 6,667,724 B2 | 12/2003 | Barnes et al. | |
| 6,670,909 B2 | 12/2003 | Kim | |
| 6,671,310 B1 | 12/2003 | Richards et al. | |
| 6,674,396 B2 | 1/2004 | Richards et al. | |
| 6,677,796 B2 | 1/2004 | Brethour et al. | |
| 6,700,538 B1 | 3/2004 | Richards | |
| 6,710,736 B2 | 3/2004 | Fullerton et al. | |
| 6,717,992 B2 | 4/2004 | Cowie et al. | |
| 6,748,040 B1 | 6/2004 | Johnson et al. | |
| 6,750,757 B1 | 6/2004 | Gabig, Jr. et al. | |
| 6,759,948 B2 | 7/2004 | Grisham et al. | |
| 6,760,387 B2 | 7/2004 | Langford et al. | |
| 6,762,712 B2 | 7/2004 | Kim | |
| 6,763,057 B1 | 7/2004 | Fullerton et al. | |
| 6,763,282 B2 | 7/2004 | Glenn et al. | |
| 6,774,846 B2 | 8/2004 | Fullerton et al. | |
| 6,774,859 B2 | 8/2004 | Schantz et al. | |
| 6,778,603 B1 | 8/2004 | Fullerton et al. | |
| 6,781,530 B2 | 8/2004 | Moore | |
| 6,782,048 B2 | 8/2004 | Santhoff | |
| 6,788,730 B1 | 9/2004 | Richards et al. | |
| 6,822,604 B2 | 11/2004 | Hall et al. | |
| 6,823,022 B1 | 11/2004 | Fullerton et al. | |
| 6,836,223 B2 | 12/2004 | Moore | |
| 6,836,226 B2 | 12/2004 | Moore | |
| 6,845,253 B1 | 1/2005 | Schantz | |
| 6,847,675 B2 | 1/2005 | Fullerton et al. | |
| 6,879,878 B2 | 4/2005 | Glenn et al. | |
| 6,882,301 B2 | 4/2005 | Fullerton | |
| 6,895,034 B2 | 5/2005 | Nunally et al. | |
| 6,900,732 B2 | 5/2005 | Richards | |
| 6,906,625 B1 | 6/2005 | Taylor et al. | |
| 6,907,244 B2 | 6/2005 | Santhoff et al. | |
| 6,912,240 B2 | 6/2005 | Kumar et al. | |
| 6,914,949 B2 | 7/2005 | Richards et al. | |
| 6,917,284 B2 | 7/2005 | Grisham et al. | |
| 6,919,838 B2 | 7/2005 | Santhoff | |
| 6,922,166 B2 | 7/2005 | Richards et al. | |
| 6,922,177 B2 | 7/2005 | Barnes et al. | |
| 6,925,109 B2 | 8/2005 | Richards et al. | |
| 6,933,882 B2 | 8/2005 | Fullerton | |
| 6,937,639 B2 | 8/2005 | Pendergrass et al. | |
| 6,937,663 B2 | 8/2005 | Jett et al. | |
| 6,937,667 B1 | 8/2005 | Fullerton et al. | |
| 6,937,674 B2 | 8/2005 | Santhoff et al. | |
| 6,947,492 B2 | 9/2005 | Santhoff et al. | |
| 6,950,485 B2 | 9/2005 | Richards et al. | |
| 6,954,480 B2 | 10/2005 | Richards et al. | |
| 6,959,031 B2 | 10/2005 | Haynes et al. | |
| 6,959,032 B1 | 10/2005 | Richards et al. | |
| 6,963,727 B2 | 11/2005 | Shreve | |
| 6,965,960 B2 * | 11/2005 | Liu | 710/305 |
| 6,980,613 B2 | 12/2005 | Krivokapic | |
| 6,980,918 B2 * | 12/2005 | Gunther et al. | 702/132 |
| 6,989,751 B2 | 1/2006 | Richards | |
| 7,015,793 B2 | 3/2006 | Gabig, Jr. et al. | |
| 7,020,224 B2 | 3/2006 | Krivokapic | |
| 7,027,425 B1 | 4/2006 | Fullerton et al. | |
| 7,027,483 B2 | 4/2006 | Santhoff et al. | |
| 7,027,493 B2 | 4/2006 | Richards | |
| 7,030,806 B2 | 4/2006 | Fullerton | |
| 7,042,417 B2 | 5/2006 | Santhoff et al. | |
| 7,046,187 B2 | 5/2006 | Fullerton et al. | |
| 7,046,618 B2 | 5/2006 | Santhoff et al. | |
| 7,069,111 B2 | 6/2006 | Glenn et al. | |
| 7,075,476 B2 | 7/2006 | Kim | |
| 7,079,827 B2 | 7/2006 | Richards et al. | |
| 7,099,367 B2 | 8/2006 | Richards et al. | |
| 7,099,368 B2 | 8/2006 | Santhoff et al. | |
| 7,129,886 B2 | 10/2006 | Hall et al. | |
| 7,132,975 B2 | 11/2006 | Fullerton et al. | |
| 7,145,954 B1 | 12/2006 | Pendergrass et al. | |
| 7,148,791 B2 | 12/2006 | Grisham et al. | |
| 7,151,490 B2 | 12/2006 | Richards | |
| 7,167,525 B2 | 1/2007 | Santhoff et al. | |
| 7,170,408 B2 | 1/2007 | Taylor et al. | |
| 7,184,938 B1 | 2/2007 | Lansford et al. | |
| 7,190,722 B2 | 3/2007 | Lakkis et al. | |
| 7,190,729 B2 | 3/2007 | Siwiak | |
| 7,206,334 B2 | 4/2007 | Siwiak | |
| 7,209,724 B2 | 4/2007 | Richards et al. | |
| 7,212,786 B2 * | 5/2007 | Kojima et | 455/41.2 |
| 7,230,980 B2 | 6/2007 | Langford et al. | |
| 7,239,277 B2 | 7/2007 | Fullerton et al. | |
| RE39,759 E | 8/2007 | Fullerton | |
| 7,256,727 B2 | 8/2007 | Fullerton et al. | |
| 7,271,779 B2 | 9/2007 | Hertel | |
| 7,292,620 B2 * | 11/2007 | Green et al. | 375/146 |
| 7,333,551 B2 * | 2/2008 | Hwang et al. | 375/265 |
| 7,555,585 B2 * | 6/2009 | Gupta et al. | 710/241 |
| 7,590,162 B2 * | 9/2009 | Volodin et al. | 372/102 |
| 7,643,533 B2 * | 1/2010 | McCorkle | 375/130 |
| 7,787,913 B2 * | 8/2010 | Cornell | 455/575.2 |
| 7,844,847 B2 * | 11/2010 | Hurley | 713/400 |
| 7,958,483 B1 * | 6/2011 | Alben et al. | 716/133 |
| 2005/0172201 A1 | 8/2005 | Kutz et al. | |
| 2007/0234186 A1 | 10/2007 | Mo et al. | |
| 2008/0101268 A1 | 5/2008 | Sammour et al. | |
| 2008/0130510 A1 | 6/2008 | Cho et al. | |

FOREIGN PATENT DOCUMENTS

| | | |
|---|---|---|
| JP | 2007036593 A | 2/2007 |
| RU | 2110889 C1 | 5/1998 |
| RU | 2201655 C2 | 3/2003 |
| TW | I281798 B | 5/2007 |
| WO | WO2005041515 | 5/2005 |
| WO | WO2005043310 A2 | 5/2005 |
| WO | WO2005043829 | 5/2005 |
| WO | WO2005043855 | 5/2005 |
| WO | WO2007127884 A2 | 11/2007 |
| WO | WO2008054103 | 5/2008 |

OTHER PUBLICATIONS

Written Opinion—PCT/US2009/049365—ISA/EPO—Apr. 9, 2009.
Taiwan Search Report—TW098122969—TIPO—Aug. 3, 2012.

* cited by examiner

SYSTEM AND METHOD OF PUNCTURING PULSES IN A RECEIVER OR TRANSMITTER

CROSS-REFERENCE TO RELATED APPLICATION

This application claims the benefit of the filing date of Provisional Patent Application Ser. No. 61/078,648, filed on Jul. 7, 2008, which is incorporated herein by reference.

FIELD

The present disclosure relates generally to communications systems, and more specifically, to a system and method of puncturing pulses in a receiver or transmitter.

BACKGROUND

Many current wireless communications devices are portable, allowing users to communicate with others while at the same time remaining mobile. Because of their portability, such communications devices operate using limited power sources, such as batteries. Communications devices operating using limited power sources typically have a limited continuous use life. The length of the continuous use life generally depends on the capability of the limited power source and the power consumption of the device. Generally, the greater the capability of the limited power source, the longer the continuous use life of the device. Also, the more power the device consumes, the shorter the continuous use life of the device.

Accordingly, to improve the continuous use life of wireless communications devices, such devices are designed to operate in a power efficient manner. One technique for improved power efficiency is for the communication devices to communicate with other devices using narrow width pulses (e.g., ultra wideband pulses), and operate in a relatively low power mode when not communicating with other devices. Such communications technique may result in substantial improvement in power efficiency over that of devices that operate continuous regardless of whether they are communicating.

Although this communications technique may result in significant power efficiency improvement, there may be room for further improvement in power efficiency. For instance, if all the pulses that make up the information that is being communicated need not be transmitted or received and some pulses may be discarded or punctured, the communications device may operate in the relatively low power mode for a longer period of time. This would further improve the power efficiency of the device, and consequently, the length of its continuous use life.

SUMMARY

An aspect of the disclosure relates to an apparatus for data communication. The apparatus comprises a first module adapted to determine a pulse puncturing rate, and a second module adapted to receive pulses based on the pulse puncturing rate. In another aspect, the second module is adapted to puncture pulses based on the pulse puncturing rate. In another aspect, the second module is adapted to operate in a lower power consumption mode based on the pulse puncturing rate. In another aspect, the apparatus comprises a third module adapted to transmit information related to the pulse puncturing rate to a remote communications device. In another aspect, the second module is adapted to receive pulses from the remote communications device.

In another aspect of the disclosure, the first module of the apparatus is adapted to determine the pulse puncturing rate by receiving information related to initial pulses, determine one or more characteristics based on the initial pulses, and determine the pulse puncturing rate based on the one or more characteristics. In another aspect, the one or more characteristics comprise at least one of a symbol error rate or a symbol erasure rate. In another aspect, the second module is adapted to generate the information related to the initial pulses by performing a Viterbi decoding and a convolutional encoding based on the initial pulses. In another aspect, the second module is adapted to generate the information related to the initial pulses by performing a Viterbi decoding, Reed-Solomon decoding, Reed-Solomon encoding operation, and a convolutional encoding based on the initial pulses. In another aspect, the second module is adapted to substantially square the initial pulses to generate a first signal, filter the first signal to generate a second signal, and slice the second signal to generate a third signal from which the information related to the initial pulses is determined.

In another aspect, the first module is adapted to determine the pulse puncturing rate by performing a table look up or an equation operation using the one or more characteristics. In another aspect, the first module is adapted to continually determine one or more characteristics of successive pulses to continually update the pulse puncturing rate. In another aspect, the first module is adapted to select a number of initial pulses used in determining the pulse puncturing rate to achieve a defined resolution for the pulse puncturing rate or a defined processing time for determining the pulse puncturing rate. In another aspect, the first module is adapted to select a number of successive pulses used in determining a new pulse puncturing rate to achieve a defined resolution for the new pulse puncturing rate or a defined processing time for determining the new pulse puncturing rate.

Another aspect of the disclosure relates to an apparatus for data communication, comprising a first module adapted to transmit a first set of pulses and a subset of a second set of pulses, and a second module adapted to receive information related to a pulse puncturing rate based on the first set of pulses, wherein the subset of the second set of pulses is based on the pulse puncturing rate information. In another aspect, the apparatus comprises a third module adapted to modulate the first or second set of pulses based on received data. In another aspect, the second set of pulses is based on a pulse puncturing rate substantially equal to zero (0) (e.g., no pulses being punctured). In other aspects, the first module comprises a receiver, the second module comprises a transmitter, and the third module comprises a pulse modulator.

In another aspect, each pulse may be configured to have a fractional spectrum on the order of 20% or more, a spectrum on the order of 500 MHz or more, or a fractional spectrum on the order of 20% or more and a spectrum on the order of 500 MHz or more.

Other aspects, advantages and novel features of the present disclosure will become apparent from the following detailed description of the disclosure when considered in conjunction with the accompanying drawings.

DETAILED DESCRIPTION

Various aspects of the disclosure are described below. It should be apparent that the teachings herein may be embodied in a wide variety of forms and that any specific structure, function, or both being disclosed herein are merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As an example of some of the above concepts, in some aspects, the disclosure relates to an apparatus for data communication that receives a plurality of pulses from a remote communications device, determines a pulse puncturing rate based on the received pulses, and punctures or discards subsequently received pulses based on the pulse puncturing rate. During intervals when punctured pulses are to be expected, the apparatus operates in a lower power consumption mode for the purpose of conserving power. In this example, the apparatus performs both the determining of the pulse puncturing rate and the puncturing of the pulses.

In another example, a receiving apparatus determines the pulse puncturing rate based on received pulses, and transmits the pulse puncturing rate information to a transmitting apparatus. In response, the transmitting apparatus sends a subset of the pulses it would have transmitted, wherein the subset is based on the pulse puncturing rate. Accordingly, in this example, the puncturing of the pulses occurs in the transmitting apparatus. Because the receiving apparatus receives fewer pulses (e.g., a subset), the receiving apparatus may operate in a lower power consumption mode for longer periods in order to conserve power. Additionally, because the transmitting apparatus transmits fewer pulses, it may also operate in a lower power consumption mode for longer periods in order to conserve power.

Figure 1A:
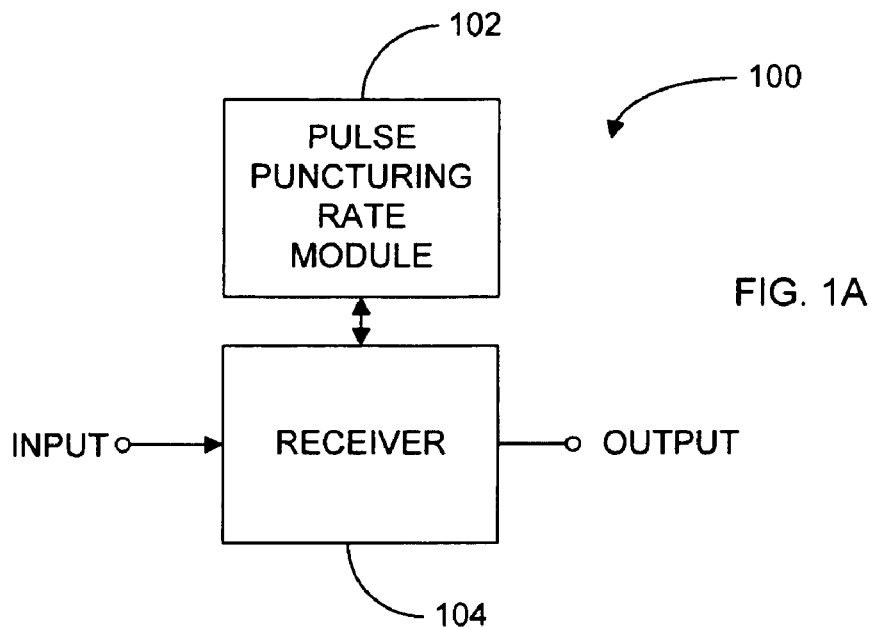
FIG. 1A illustrates a block diagram of an exemplary communications system in accordance with an aspect of the disclosure.

FIG. 1A illustrates a block diagram of an exemplary communications system 100 in accordance with an aspect of the disclosure. In summary, the system 100 receives a plurality of pulses (e.g., an initial or subsequent set of pulses), determines a pulse puncturing rate based on the received pulses, and punctures or discards the received pulses based on the pulse puncturing rate. During intervals when punctured pulses are to be expected, the system 100 operates in a lower power consumption mode for the purpose of conserving power. As an example, the system 100 may turn off one or more of its components, such as its front-end radio frequency (RF) circuitry and/or others.

In particular, the communications system 100 comprises a pulse puncturing rate module 102 and a receiver 104. The system 100 receives a plurality of pulses from a remote communications device via an input. As discussed further herein, the plurality of pulses may convey particular information using any number of pulse modulation techniques. The pulse puncturing rate module 102 receives information related to the demodulated pulses from the receiver 104, and determines a pulse puncturing rate based on this information. The information obtained from receiver 104 by the pulse puncturing module 102 may include demodulated symbol sequence, decoded bit sequence, re-encoded bit sequence, estimates of the channel condition between the communications system 100 and the remote device, etc. The channel condition may be estimated based on the received pulses.

Based on the pulse puncturing rate determined by the pulse puncturing rate module 102, the receiver 104 discards or punctures some of the pulses received from the remote communications device. During intervals when punctured pulses are to be expected, the receiver 104 operates in a lower power consumption mode for the purpose of conserving power. As an example, the receiver 104 may turn off one or more of its components, such as its front-end radio frequency (RF) circuitry and/or others.

The pulse puncturing rate module 102 may determine the pulse puncturing rate based on initial pulses received from the remote communications device. This pulse puncturing rate may be used for receiving some or all of the successive pulses received from the remote communications device. Alternatively, the pulse puncturing rate module 102 may continuously, repeatedly, or in another manner, update the pulse puncturing rate based on the pulses received after the initial pulses. In this manner, the pulse puncturing rate may better track the channel condition as it changes over time.

Alternatively, or in addition to, the pulse puncturing rate module 102 may select and subsequently change the number of pulses it uses to determine the pulse puncturing rate. For example, the pulse puncturing rate module 102 may operate in a relatively high resolution mode, where it uses a relatively large number of received pulses to determine the pulse puncturing rate. This has the advantage of achieving a higher pulse puncturing rate because of the higher resolution or more accurate determination of the rate. This helps to improve the power efficiency of the device at a cost of a longer processing time for determining the pulse puncturing rate.

Conversely, the pulse puncturing rate module 102 may operate in a relatively low resolution mode, where it uses a relatively small number of received pulses to determine the pulse puncturing rate. This has the advantage of improving the processing time for determining the pulse puncturing rate with a cost of achieving a more conservative pulse puncturing rate because of the lower resolution or less accurate determination of the rate. The pulse puncturing rate module 102 may keep the resolution constant while it continuous to receive pulses from the remote communications device, or it may change the resolution based on any number of factors.

Figure 1B:
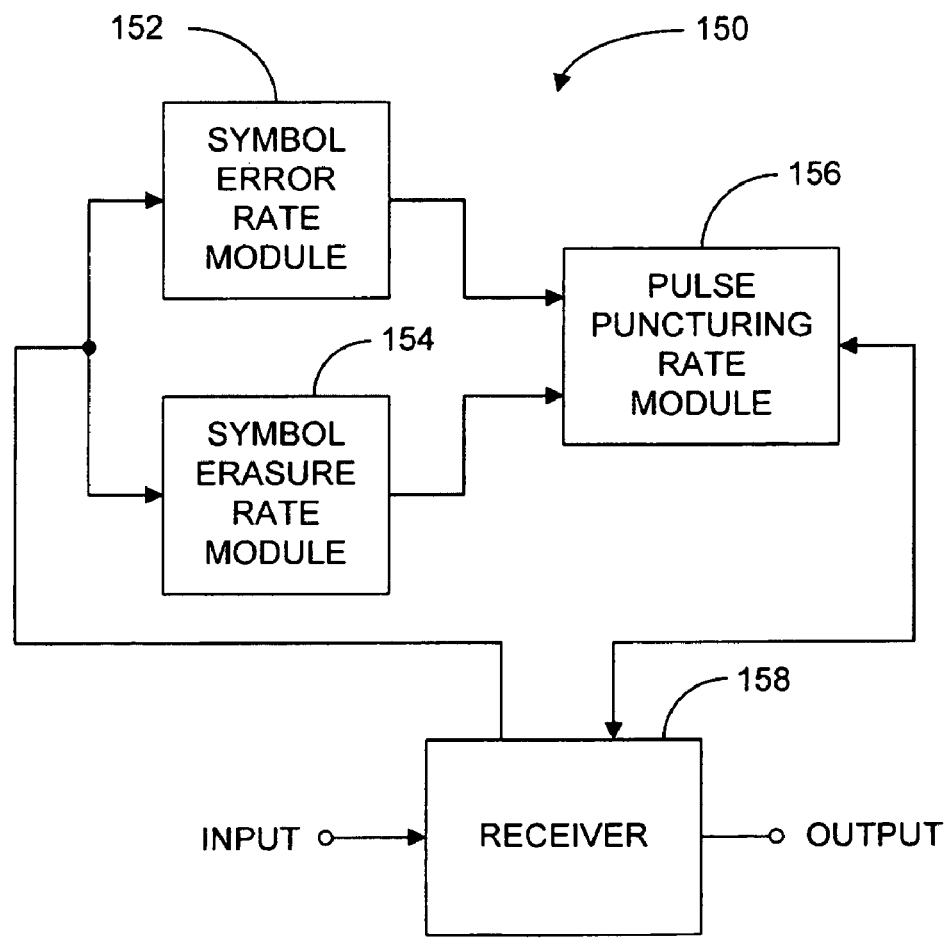
FIG. 1B illustrates a block diagram of another exemplary communications system in accordance with another aspect of the disclosure.

FIG. 1B illustrates a block diagram of another exemplary communications system 150 in accordance with another aspect of the disclosure. The communications system 150 may be one example of a particular implementation of the communications system 100. In summary, the communications system 150 estimates the channel condition by determining a symbol error rate and a symbol erasure rate based on a plurality of pulses received from a remote communications device. A symbol may comprise one or more pulses. The system 150 then determines the pulse puncturing rate based on the symbol error rate and the symbol erasure rate. The system 150 then discards or punctures some of the subsequently received pulses based on the pulse puncturing rate. During intervals when punctured pulses are to be expected, the system 150 operates in a lower power consumption mode for the purpose of conserving power.

In particular, the communications system 150 comprises a symbol error rate module 152, a symbol erasure rate module 154, a pulse puncturing rate module 156, and a receiver 158. The symbol error rate module 152 receives information related to a plurality of demodulated pulses from the receiver 158, and determines a symbol error rate based on the received information. As explained in more detail below, the symbol error rate may be related to a ratio between the estimated number of received pulses in error and the number of received pulses that are non-erased. The symbol erasure rate module 154 receives information related to the plurality of demodulated pulses from the receiver 158, and determines a symbol erasure rate based on the received information. As explained in more detail below, the symbol erasure rate may be related to a ratio between the number of non-zero values from the output of a pulse demodulator (a component of the receiver 158) and the total number of received pulses.

The pulse puncturing rate module 156 receives the symbol error rate from the symbol error rate module 152 and the symbol erasure rate from the symbol erasure rate module 154, and determines the pulse puncturing rate based on the symbol error rate and the symbol erasure rate. The pulse puncturing rate module 156 may determine the pulse puncturing rate by performing a table look up operation using the symbol error rate and symbol erasure rate as indices. Alternatively, the pulse puncturing rate module 156 may determine the pulse puncturing rate by performing an equation operation using the symbol error rate and symbol erasure rate as inputs.

The receiver 158 receives the pulse puncturing rate from the pulse puncturing module 156, and discards or punctures some of the subsequently received pulses based on the pulse puncturing rate. During intervals when punctured pulses are to be expected, the receiver 158 may operate in a lower power consumption mode for the purpose of conserving power. As an example, the receiver 158 may turn off one or more of its components, such as its front-end radio frequency (RF) circuitry and/or others. The pulse puncturing module 156 may also use additional information from the receiver module 158 as illustrated later in the exemplary module in FIG. 3.

Figure 2A:
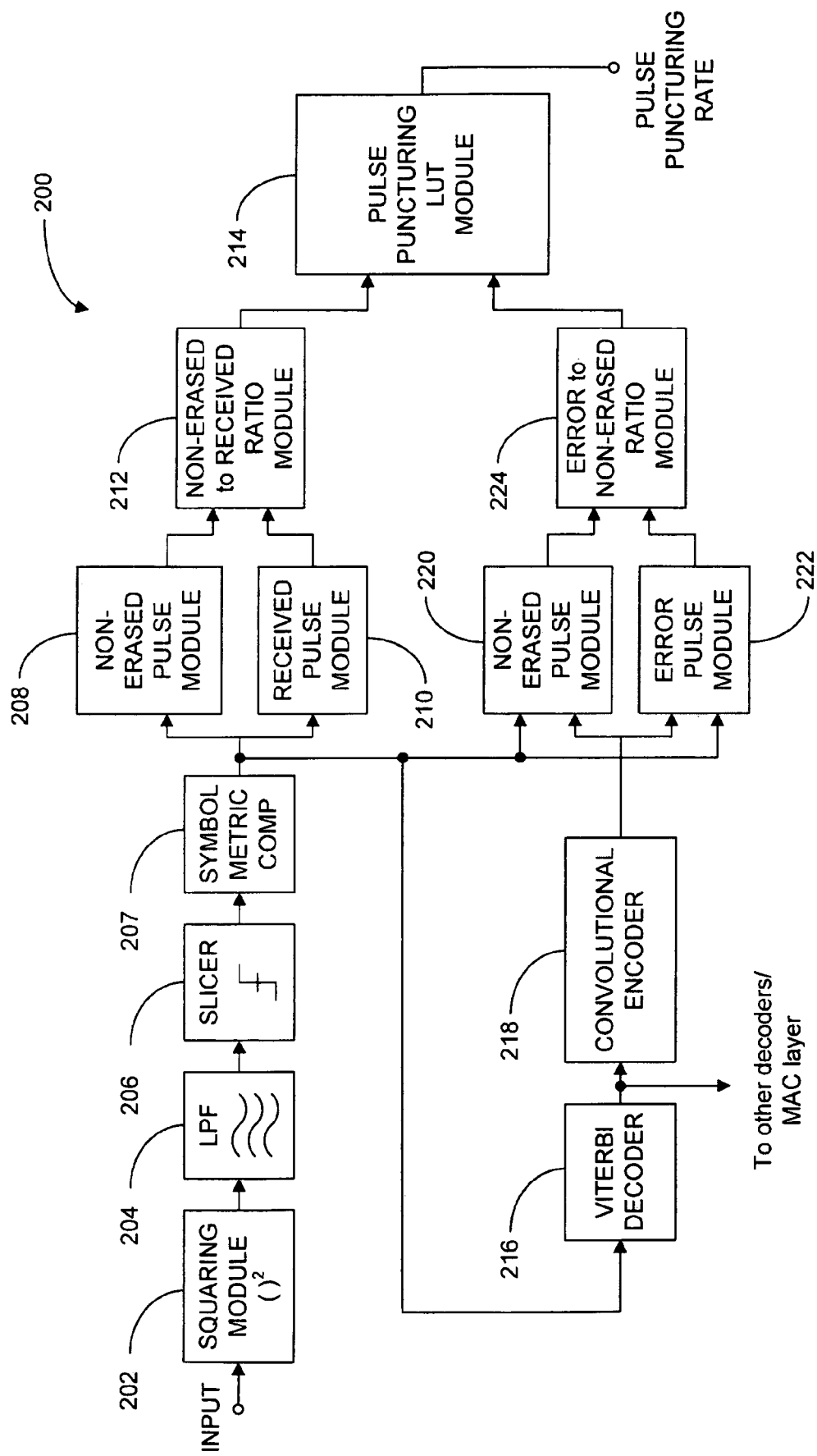
FIG. 2A illustrates a block diagram of an exemplary pulse puncturing rate module in accordance with another aspect of the disclosure.

FIG. 2A illustrates a block diagram of an exemplary pulse puncturing rate module 200 in accordance with another aspect of the disclosure. For the purpose of this example, it is assumed that the system outer code is a convolutional code. The technique is applicable to any other outer coding scheme.

Further, it is assumed that there is one pulse per modulated symbol. This technique is also applicable to multiple pulses per symbol. The pulse puncturing rate module 200 may be one example of a particular implementation of the pulse puncturing rate modules 102 and the combination of 152, 154 and 156, previously discussed. In summary, the pulse puncturing module 200 includes a first sub-module adapted to demodulate the received pulses (this sub-module may be part of the receivers previously discussed), a second sub-module adapted to estimate the true channel input (this sub-module may be part of the receivers previously discussed), a third sub-module adapted to determine the symbol erasure rate from the outputs of the first and second sub-modules, a fourth sub-module adapted to determine the symbol error rate from the outputs of the first and second sub-modules, and a fifth sub-module adapted to determine the pulse puncturing rate from the outputs of the third and fourth sub-modules.

In particular, the first sub-module for demodulating the received pulses comprises a squaring module 202 for substantially squaring the pulses, a low pass filer (LPF) 204 for removing noise and higher order harmonics from the output of the squaring module 202, and a slicer 206 for quantifying the output of the low pass filter 204. The output of the slicer 206 may be quantized to three levels (e.g., $-1, 0, +1$). The first level (e.g., $-1$) represents a logic zero (0), the second level (e.g., 0) represents an erasure, and the third level (e.g., $+1$) presents a logic one (1). The slicer 206 may output multiple such values for each received symbol. A symbol metric computation block 207 processes the slicer output and computes a metric for each received symbol. This symbol metric is used by the decoding chain to estimate the true channel input.

The second sub-module for estimating the true channel input comprises a Viterbi decoder 216 and a convolutional encoder 218. As known in the relevant art, the Viterbi decoder 216 receives the output of the symbol metric computation block 207, and generates an estimate of the sequence of bits at the input of the convolutional encoder at the remote communication device. The convolutional encoder 218 re-encodes the estimated sequence generated by the Viterbi decoder 216. The output of the convolutional encoder 218 provides an estimate of the true channel input, e.g., the symbol or pulse sequence transmitted by the remote communication device.

The third sub-module for determining the symbol erasure rate comprises a non-erased pulse module 208, a received pulse module 210, and a non-erased-to-received ratio module 212. The non-erased pulse module 208 determines the number of non-erased pulses; e.g., the non-zero values outputted by the symbol metric computation block 207. The received pulse module 210 determines the total number of received pulses. The non-erased-to-received ratio module 212 determines the ratio between the non-erased pulses and the total number of pulses, which provides the symbol erasure rate.

The fourth sub-module for determining the symbol error rate comprises a non-erased pulse module 220, an error pulse module 222, and an error-to-non-erased ratio module 224. The non-erased pulse module 220 determines the number of non-erased pulses; e.g., the non-zero values outputted by the symbol metric computation block 207. This is the same operation as module 208, so one of these modules may be eliminated. The error pulse module 222 estimates the number of the received pulses that are in error by comparing the received pulse sequence and the output of the convolutional encoder 218. The error-to-non-erased ratio module 224 determines the ratio between the pulses in error and the non-erased pulses, which provides the symbol error rate.

The fifth sub-module for determining the pulse puncturing rate comprises a pulse puncturing look-up-table (LUT) module 214 that receives the symbol erasure rate from the non-erased-to-received ratio module 212 and the symbol error rate from the error-to-non-erased ratio module 224, and generates the pulse puncturing rate by performing a table look-up using the symbol erasure rate and symbol error rate. Alternatively, the module 214 may determine the pulse puncturing rate by performing an equation operation using the symbol erasure rate and symbol error rate as inputs.

Figure 2B:
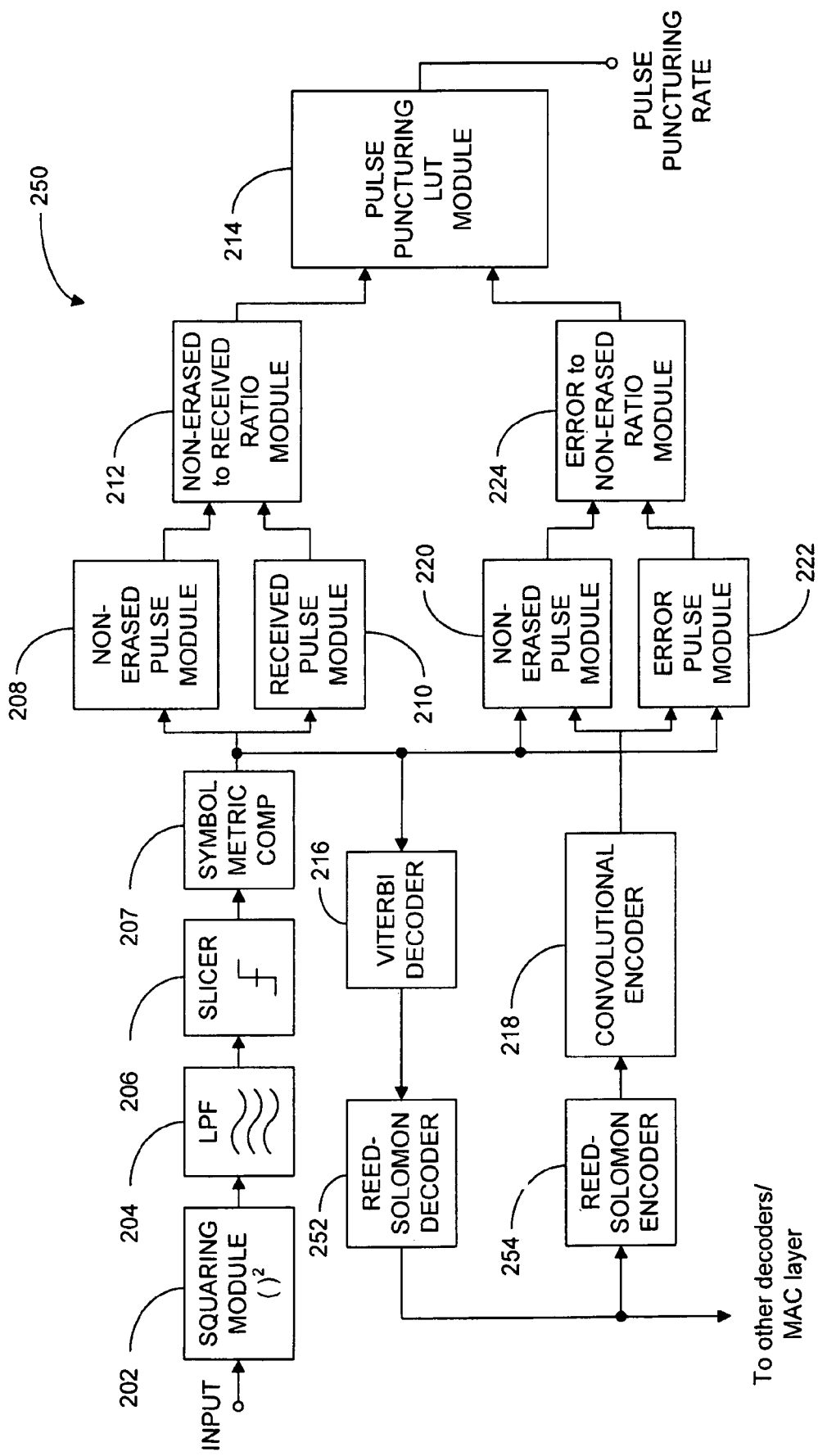
FIG. 2B illustrates a block diagram of another exemplary pulse puncturing rate module in accordance with another aspect of the disclosure.

FIG. 2B illustrates a block diagram of an exemplary pulse puncturing rate module 250 in accordance with another aspect of the disclosure. For the purpose of this example, it is assumed that the system contains a Reed-Solomon code concatenated with the outer convolutional code. The pulse puncturing rate module 250 employs another technique in estimating the true channel input. That is, instead of using only the outer code (Viterbi decoder 216 and convolutional encoder 218) to generate the estimate of the true channel input, the pulse puncturing rate module 250 uses additionally a Reed-Solomon decoder 252 to perform error correction of the output of the Viterbi decoder 216, a Reed-Solomon encoder 254 to re-encode the output of the Reed-Solomon decoder 252. The convolutional encoder 218 generates an estimate of the true channel input from the output of the Reed-Solomon encoder 254. It shall be understood that other algorithms for estimating the true channel input may be employed, and that the technique is applicable to other concatenated codes.

Figure 3:
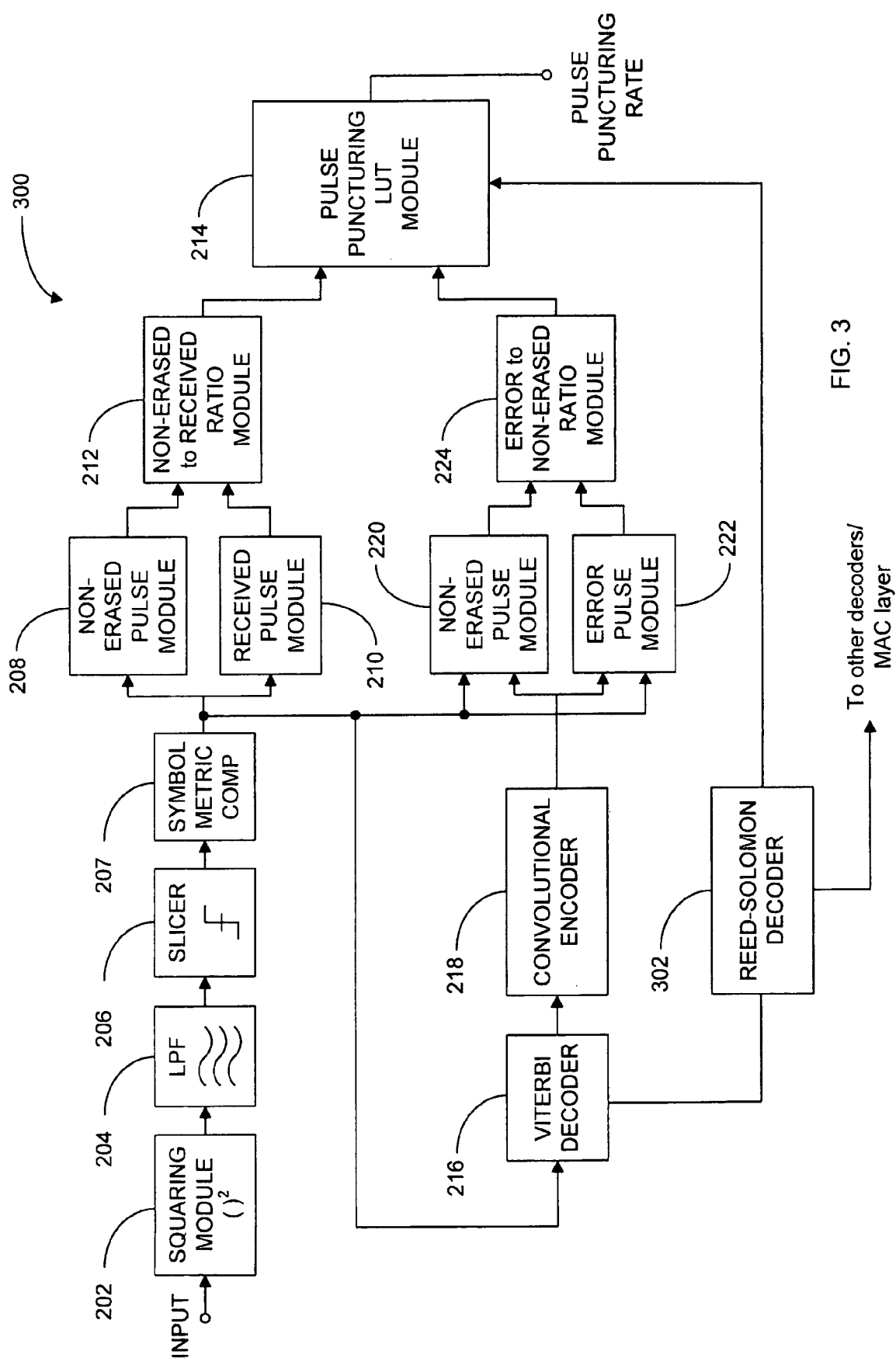
FIG. 3 illustrates a block diagram of another exemplary pulse puncturing rate module in accordance with another aspect of the disclosure.

FIG. 3 illustrates a block diagram of another exemplary pulse puncturing rate module 300 in accordance with another aspect of the disclosure. For the purpose of this example, it is assumed that the system contains a Reed-Solomon code concatenated with the outer convolutional code. The technique is applicable to any type of concatenated coding. The pulse puncturing rate module 300 is similar to module 200, and includes many of the same elements as noted by the same reference numbers. The pulse puncturing rate module 300 additionally uses information from a Reed-Solomon decoder 302 that decodes the output of the Viterbi decoder 216 to generate a control signal for the pulse puncturing rate LUT module 214.

For example, by decoding the output of the Viterbi decoder 216, the Reed-Solomon decoder 302 may determine the quality of the signal being received from the remote communications device. Based on the quality, the Reed-Solomon decoder 302 may control the pulse puncturing determination operation performed by module 214. As an example, if the quality of the signal being received is relatively high, the Reed-Solomon decoder 302 may instruct the module 214 to select a look-up table with more aggressive or higher pulse puncturing rates for given sets of symbol error rate and symbol erasure rate. Conversely, if the quality of the signal being received is relatively low, the Reed-Solomon decoder 302 may instruct the module 214 to select a look-up table with less aggressive or lower pulse puncturing rate for given sets of symbol error rate and symbol erasure rate.

Figure 4:
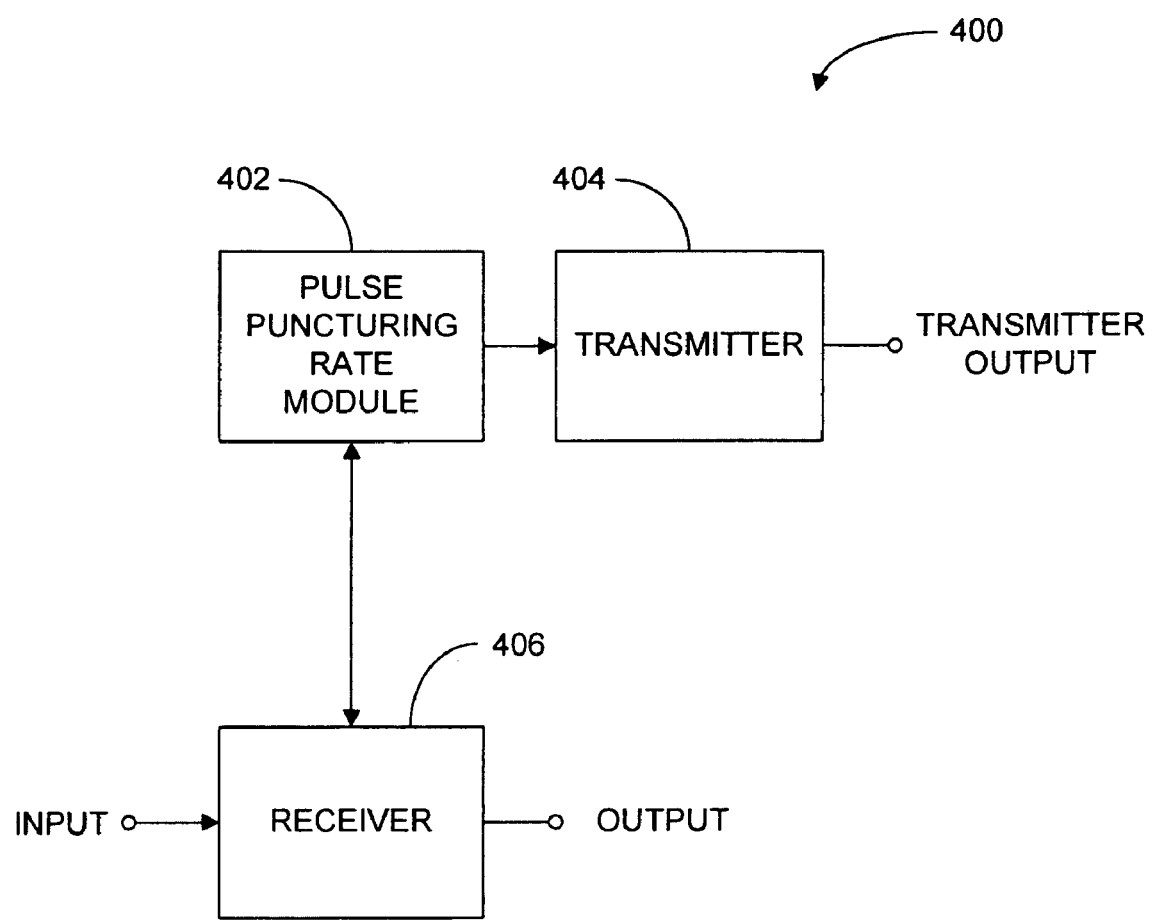
FIG. 4 illustrates a block diagram of yet another exemplary communications system in accordance with another aspect of the disclosure.

FIG. 4 illustrates a block diagram of an exemplary communications system 400 in accordance with another aspect of the disclosure. In the systems 100 and 150 previously discussed, a receiving communications device may receive pulses from a remote communications device, determine the pulse puncturing rate based on the received pulses, and discard or puncture subsequently received pulses based on the determined pulse puncturing rate. And, as previously discussed, the receiving communications device may operate in a relatively low power mode during time intervals associated with the punctured pulses in order to conserve power.

In contrast, the communications system 400 receives a plurality of pulses from a remote communications device, determines a pulse puncturing rate based on the received pulses, transmits the pulse puncturing rate to the remote communications device, and receives a subset of the pulses it would have received from the remote communications device, wherein the subset is based on the pulse puncturing rate. In other words, the puncturing of the pulses occurs at the remote communications device.

In particular, the communications system 400 comprises a pulse puncturing rate module 402, a transmitter 404, and a receiver 406. The receiver 406 receives a plurality of pulses from a remote communications device. The pulse puncturing rate module 402 receives information related to the plurality of pulses from the receiver 406. The module 402 then determines a pulse puncturing rate based on the information. The pulse puncturing rate module 402 then sends the pulse puncturing rate to the transmitter 404, which transmits the information to the remote communications device. As discussed in more detail with reference to the system associated with FIGS. 5A-B, the remote communications system uses the pulse puncturing rate to only transmit a subset of the pulses it would have transmitted, wherein the subset is based on the pulse puncturing rate. In other words, the puncturing of the pulses occurs at the transmitter end instead of at the receiver end as in systems 100 and 150. The receiver 406 then subsequently receives the subset of pulses from the remote communications device in order to ascertain the information being communicated.

Alternatively, instead of the communications system 400 transmitting the pulse puncturing rate information to the remote communications device, the system may transmit information from which the remote communications device may determine the pulse puncturing rate. For example, the communications system 400 may receive the pulses from the remote communications device, determine the symbol error rate and the symbol erasure rate based on the received pulses, and transmit these rates to the remote communications device. The remote communications device, in turn, determines the pulse puncturing rate based on the symbol error rate and symbol erasure rate, and transmit a subset of the pulses it would have transmitted based on the pulse puncturing rate. In this manner, the processing for determining the pulse puncturing rate is shared between the communications system 400 and the remote communications device.

Figure 5A:
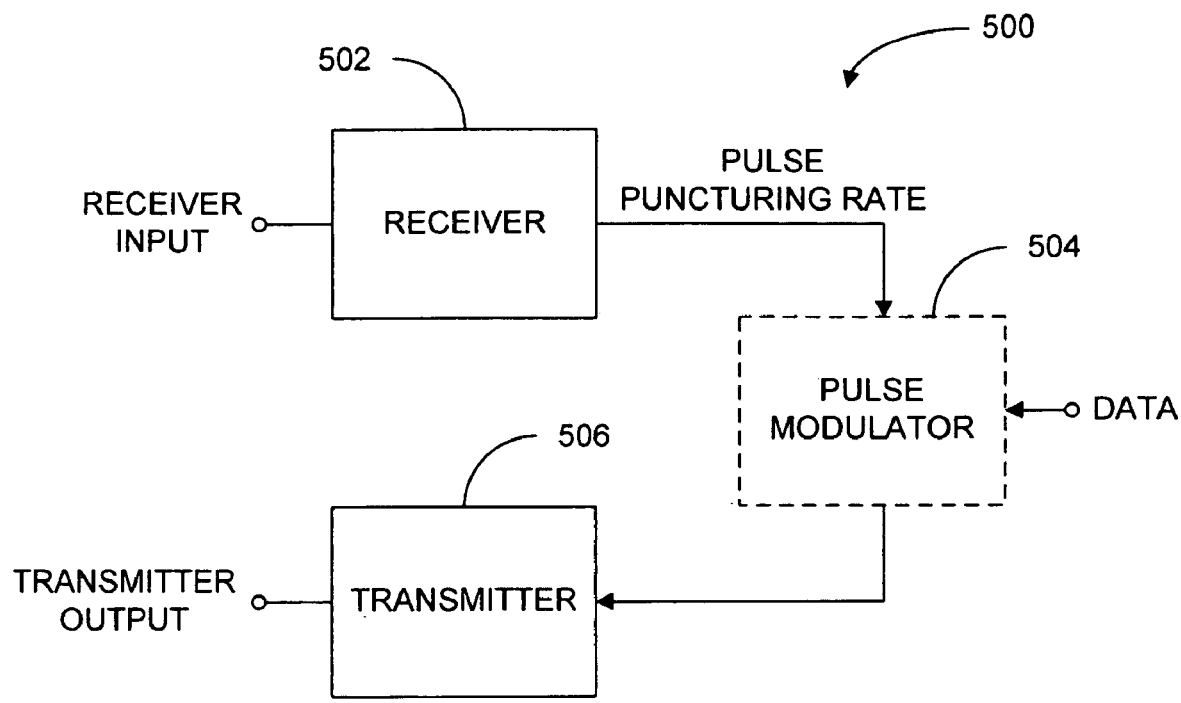
FIG. 5A illustrates a block diagram of still another exemplary communications system in accordance with another aspect of the disclosure.

FIG. 5A illustrates a block diagram of still another exemplary communications system 500 in accordance with another aspect of the disclosure. The communications system 500 is an example of a "remote" communications device as previously discussed with reference to communications system 400. In summary, the communications system 500 transmits a first set of pulses to a remote communications device (e.g., such as communications system 400), receives a pulse puncturing rate from the remote communications device, and transmits a subset of pulses it would have transmitted, wherein the subset is based on the pulse puncturing rate. In other words, the puncturing of the pulses occurs at the transmitting device, instead of the receiving device.

In particular, the communications system 500 comprises a receiver 502, optionally a pulse modulator 504, and a transmitter 506. The pulse modulator 504 modulates pulses based on received data. The pulse modulator 504 sends the modulated pulses to the transmitter 506 for transmission to a remote communications device. The remote communications device may use the received pulses to determine a pulse puncturing rate. The remote communications device then transmits the pulse puncturing rate to the communications system 500.

The receiver 502 receives the pulse puncturing rate from the remote communications device, and provides the rate to the pulse modulator 504. As previously discussed, the pulse modulator 504 modulates pulses based on the data received for transmission to the remote communications device. However, in this example, the pulse modulator 504 only provides a subset of the modulated pulses to the transmitter 506 for transmission to the remote communications device. The subset is based on the pulse puncturing rate received from the remote communications device. Since the remote communications device receives fewer pulses than it would have, it could remain in a relatively low power mode for a longer period in order to conserve power. Additionally, because the communications system 500 transmits fewer pulses, it may also operate in a lower power mode for longer periods in order to conserve power.

Figure 5B:
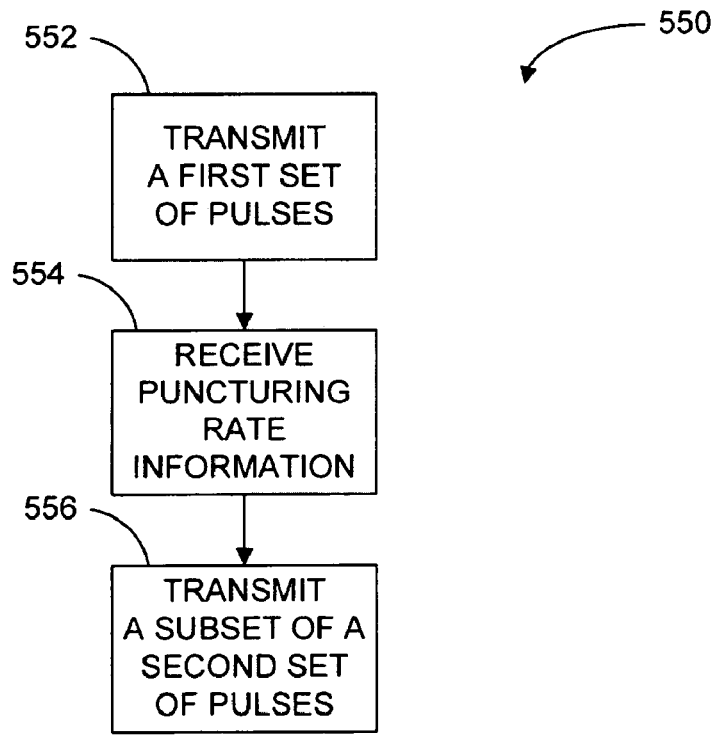
FIG. 5B illustrates a flow diagram of an exemplary method of communicating performed by the exemplary communications system of FIG. 5A in accordance with another aspect of the disclosure.

FIG. 5B illustrates a flow diagram of an exemplary method 550 of communicating performed by the exemplary communications system 500 in accordance with another aspect of the disclosure. The flow diagram merely summarizes the operation of the communications system 500 previously discussed. That is, the communications system 500 transmits a first set of pulses to a remote communications device (block 552). The communications system 500 then receives the pulse puncturing rate from the remote communications device (block 554). The communications system 500 then transmits a subset of a second set of pulses to the remote communications device, wherein the subset is based on the pulse puncturing rate (block 556). The second set of pulses may be based on a pulse puncturing rate substantially equal to zero (0). The pulse modulator 504 may verify and/or modify the received pulse puncturing rate based on any of a number of factors, and use the modified rate to perform the puncturing of the pulses.

Alternatively, instead of the communications system 500 receiving the pulse puncturing rate information to the remote communications device, the system may receive only information from which it may determine the pulse puncturing rate. For example, the communications system 500 may receive the symbol error rate and the symbol erasure rate from the remote communications device. The communications system 500 then determines the pulse puncturing rate based on the received symbol error rate and symbol erasure rate, and transmits a subset of the pulses it would have transmitted based on the pulse puncturing rate. In this manner, the processing for determining the pulse puncturing rate is shared between the communications system 500 and the remote communications device.

Figure 6A:
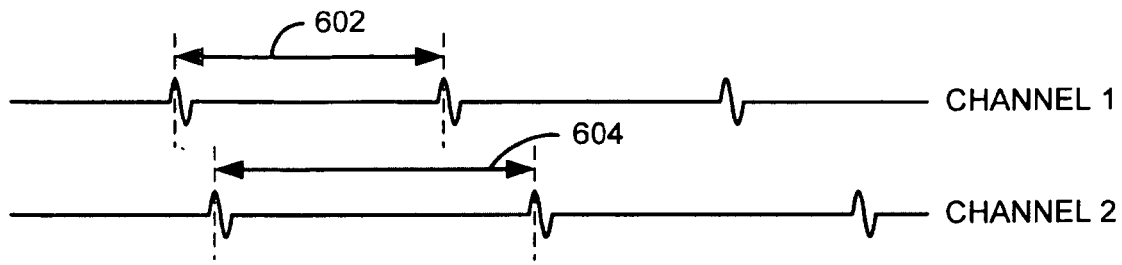
FIGS. 6A-D illustrate timing diagrams of various pulse modulation techniques in accordance with another aspect of the disclosure.

FIG. 6A illustrates different channels (channels 1 and 2) defined with different pulse repetition frequencies (PRF) as an example of a pulse modulation that may be employed in any of the communications systems described herein. Specifically, pulses for channel 1 have a pulse repetition frequency (PRF) corresponding to a pulse-to-pulse delay period 602. Conversely, pulses for channel 2 have a pulse repetition frequency (PRF) corresponding to a pulse-to-pulse delay period 604. This technique may thus be used to define pseudo-orthogonal channels with a relatively low likelihood of pulse collisions between the two channels. In particular, a low likelihood of pulse collisions may be achieved through the use of a low duty cycle for the pulses. For example, through appropriate selection of the pulse repetition frequencies (PRF), substantially all pulses for a given channel may be transmitted at different times than pulses for any other channel.

The pulse repetition frequency (PRF) defined for a given channel may depend on the data rate or rates supported by that channel. For example, a channel supporting very low data rates (e.g., on the order of a few kilobits per second or Kbps) may employ a corresponding low pulse repetition frequency (PRF). Conversely, a channel supporting relatively high data rates (e.g., on the order of a several megabits per second or Mbps) may employ a correspondingly higher pulse repetition frequency (PRF).

Figure 6B:
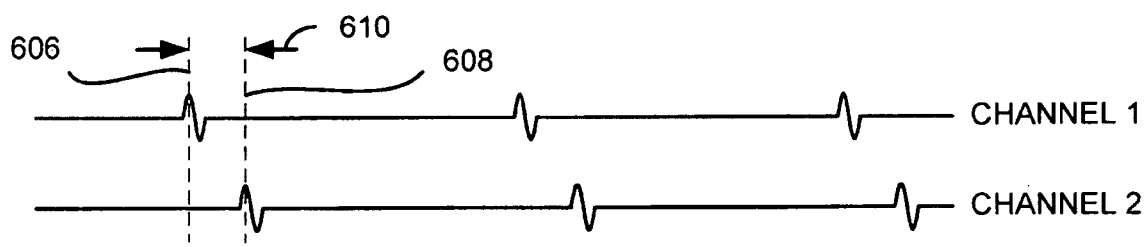

FIG. 6B illustrates different channels (channels 1 and 2) defined with different pulse positions or offsets as an example of a modulation that may be employed in any of the communications systems described herein. Pulses for channel 1 are generated at a point in time as represented by line 606 in accordance with a first pulse offset (e.g., with respect to a given point in time, not shown). Conversely, pulses for channel 2 are generated at a point in time as represented by line 608 in accordance with a second pulse offset. Given the pulse offset difference between the pulses (as represented by the arrows 610), this technique may be used to reduce the likelihood of pulse collisions between the two channels. Depending on any other signaling parameters that are defined for the channels (e.g., as discussed herein) and the precision of the timing between the devices (e.g., relative clock drift), the use of different pulse offsets may be used to provide orthogonal or pseudo-orthogonal channels.

Figure 6C:
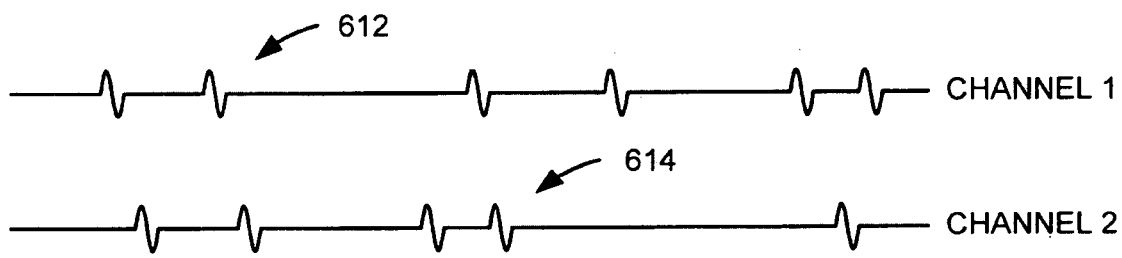

FIG. 6C illustrates different channels (channels 1 and 2) defined with different timing hopping sequences modulation that may be employed in any of the communications systems described herein. For example, pulses 612 for channel 1 may be generated at times in accordance with one time hopping sequence while pulses 614 for channel 2 may be generated at times in accordance with another time hopping sequence. Depending on the specific sequences used and the precision of the timing between the devices, this technique may be used to provide orthogonal or pseudo-orthogonal channels. For example, the time hopped pulse positions may not be periodic to reduce the possibility of repeat pulse collisions from neighboring channels.

Figure 6D:
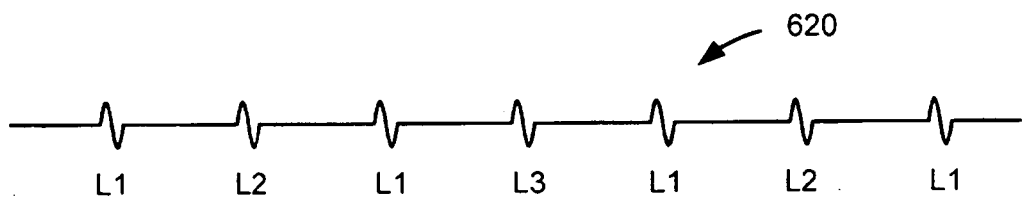

FIG. 6D illustrates different channels defined with different time slots as an example of a pulse modulation that may be employed in any of the communications systems described herein. Pulses for channel L1 are generated at particular time instances. Similarly, pulses for channel L2 are generated at other time instances. In the same manner, pulses for channel L3 are generated at still other time instances. Generally, the time instances pertaining to the different channels do not coincide or may be orthogonal to reduce or eliminate interference between the various channels.

It should be appreciated that other techniques may be used to define channels in accordance with a pulse modulation schemes. For example, a channel may be defined based on different spreading pseudo-random number sequences, or some other suitable parameter or parameters. Moreover, a channel may be defined based on a combination of two or more parameters.

Figure 7:
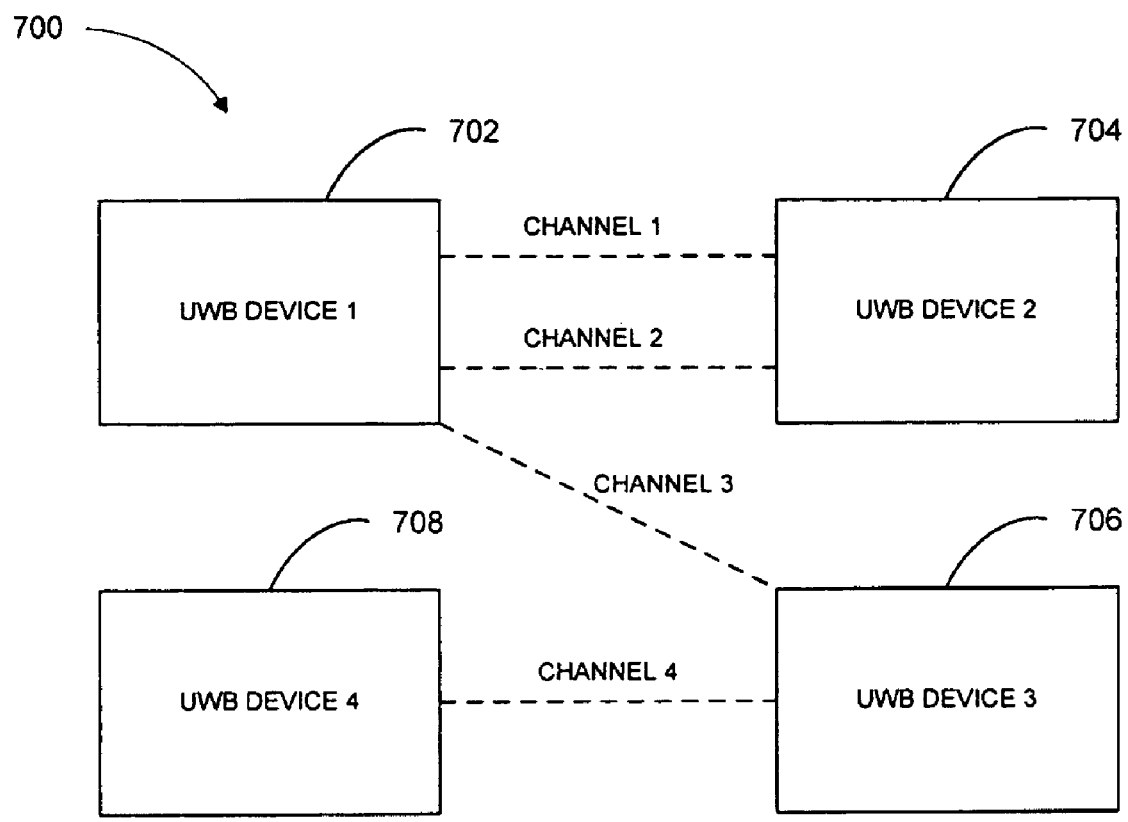
FIG. 7 illustrates a block diagram of various communications devices communicating with each other via various channels in accordance with another aspect of the disclosure.

FIG. 7 illustrates a block diagram of various ultra-wide band (UWB) communications devices communicating with each other via various channels in accordance with another aspect of the disclosure. For example, UWB device 1 702 is communicating with UWB device 2 704 via two concurrent UWB channels 1 and 2. UWB device 702 is communicating with UWB device 3 706 via a single channel 3. And, UWB device 3 706 is, in turn, communicating with UWB device 4 708 via a single channel 4. Other configurations are possible. The communications devices may be used for many different applications including medical applications, and may be implemented, for example, in a headset, microphone, biometric sensor, heart rate monitor, pedometer, EKG device, watch, shoe, remote control, switch, tire pressure monitor, or other communications devices. A medical device may include smart band-aid, sensors, vital sign monitors, and others.

Figure 8:
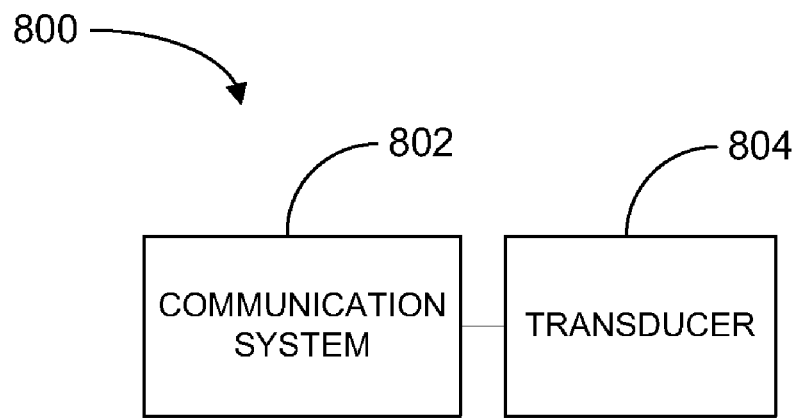
FIGS. 8-9 respectively illustrate block diagrams of a headset and a watch in accordance with other aspects of the disclosure.
Figure 9:
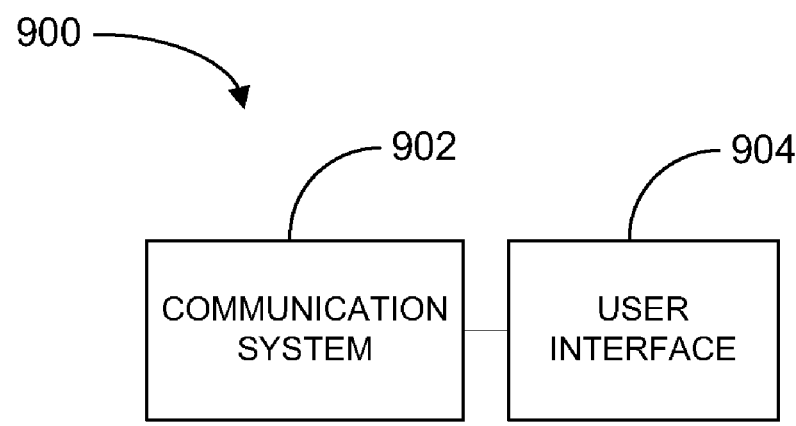

Any of the above aspects of the disclosure may be implemented in many different devices, such as a headset 800 comprising a communication system 802 described herein and a transducer 804 shown in FIG. 8, and a watch 900 comprising a communication system 902 described herein and a user interface 904 shown in FIG. 9. For example, in addition to medical applications as discussed above, the aspects of the disclosure may be applied to health and fitness applications. Additionally, the aspects of the disclosure may be implemented in shoes for different types of applications. There are other multitude of applications that may incorporate any aspect of the disclosure as described herein.

Various aspects of the disclosure have been described above. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. Additionally, the term or phrase "at least one of "a", "b", or "c", as used herein, means "a", "b", "c", or any combination thereof.

In addition, such an apparatus may be implemented or such a method may be practiced using other structure, functionality, or structure and functionality in addition to or other than one or more of the aspects set forth herein. As an example of some of the above concepts, in some aspects concurrent channels may be established based on pulse repetition frequencies. In some aspects concurrent channels may be established based on pulse position or offsets. In some aspects concurrent channels may be established based on time hopping sequences. In some aspects concurrent channels may be established based on pulse repetition frequencies, pulse positions or offsets, and time hopping sequences.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:
1. A method of data communication, comprising:
 determining a pulse puncturing rate, wherein determining the pulse puncturing rate comprises:
  receiving information related to initial pulses;
  determining one or more characteristics based on the information related to the initial pulses; and determining the pulse puncturing rate based on the one or more characteristics, wherein the one or more characteristics comprise at least one of a symbol error rate or a symbol erasure rate; and receiving pulses from a communication device by way of a wireless communication channel based on the pulse puncturing rate.

2. The method of claim 1, further comprising puncturing pulses based on the pulse puncturing rate.

3. The method of claim 1, further comprising operating a receiver of the pulses in different power modes based on the pulse puncturing rate.

4. The method of claim 1, further comprising transmitting information related to the pulse puncturing rate to the communication device.

5. The method of claim 1, wherein generating the information related to the initial pulses comprises performing a Viterbi decoding and convolutional encoding based on the initial pulses.

6. The method of claim 1, wherein generating the information related to the initial pulses comprises performing a Viterbi decoding, Reed-Solomon decoding, Reed-Solomon encoding, and convolutional encoding based on the initial pulses.

7. The method of claim 1, wherein generating the information related to the initial pulses comprises:
substantially squaring the initial pulses to generate a first signal;
filtering the first signal to generate a second signal; and
slicing the second signal to generate a third signal from which the information related to the initial pulses is determined.

8. The method of claim 1, wherein determining the pulse puncturing rate comprises performing a table look up or an equation operation using the one or more characteristics.

9. The method of claim 1, wherein determining the pulse puncturing rate comprises selecting a number of the initial pulses used in determining the pulse puncturing rate to achieve a defined resolution for the pulse puncturing rate or a defined processing time for determining the pulse puncturing rate.

10. The method of claim 1, further comprising continually determining one or more characteristics related to successive pulses to continually update the pulse puncturing rate.

11. The method of claim 10, further comprising selecting a number of successive pulses used in determining the updated pulse puncturing rate to achieve a defined resolution for the updated pulse puncturing rate or a defined processing time for determining the updated pulse puncturing rate.

12. An apparatus for data communication, comprising:
a pulse puncturing module adapted to determine a pulse puncturing rate, wherein the pulse puncturing module is adapted to determine the pulse puncturing rate by at least:
receiving information related to initial pulses;
determining one or more characteristics based on the information related to the initial pulses; and
determining the pulse puncturing rate based on the one or more characteristics, wherein the one or more characteristics comprise at least one of a symbol error rate or a symbol erasure rate; and
a receiver adapted to receive pulses from a communication device by way of a wireless communication channel based on the pulse puncturing rate.

13. The apparatus of claim 12, wherein the receiver is adapted to puncture pulses based on the pulse puncturing rate.

14. The apparatus of claim 12, wherein the receiver is adapted to operate in different power modes based on the pulse puncturing rate.

15. The apparatus of claim 12, further comprising a transmitter adapted to transmit information related to the pulse puncturing rate to the communication device.

16. The apparatus of claim 12, wherein the receiver is adapted to generate the information related to the initial pulses by performing a Viterbi decoding and convolutional encoding based on the initial pulses.

17. The apparatus of claim 12, wherein the receiver is adapted to generate the information related to the initial pulses by performing a Viterbi decoding, Reed-Solomon decoding, Reed-Solomon encoding, and convolutional encoding based on the initial pulses.

18. The apparatus of claim 12, wherein the receiver is adapted to:
substantially square the initial pulses to generate a first signal;
filter the first signal to generate a second signal; and
slice the second signal to generate a third signal from which the information related to the initial pulses is determined.

19. The apparatus of claim 12, wherein the pulse puncturing module is adapted to determine the pulse puncturing rate by performing a table look up or an equation operation using the one or more characteristics.

20. The apparatus of claim 12, wherein the pulse puncturing module is adapted to select a number of initial pulses used in determining the pulse puncturing rate to achieve a defined resolution for the pulse puncturing rate or a defined processing time for determining the pulse puncturing rate.

21. The apparatus of claim 12, wherein the pulse puncturing module is adapted to continually determine one or more characteristics of successive pulses to continually update the pulse puncturing rate.

22. The apparatus of claim 21, wherein the pulse puncturing module is adapted to select a number of successive pulses used in determining a new pulse puncturing rate to achieve a defined resolution for the new pulse puncturing rate or a defined processing time for determining the new pulse puncturing rate.

23. An apparatus for data communication, comprising:
means for determining a pulse puncturing rate, wherein the pulse puncturing rate determining means comprises:
means for receiving information related to initial pulses;
means for determining one or more characteristics based on the information related to the initial pulses; and
means for determining the pulse puncturing rate based on the one or more characteristics, wherein the one or more characteristics comprise at least one of a symbol error rate or a symbol erasure rate; and
means for receiving pulses from a communication device by way of a wireless communication channel based on the pulse puncturing rate.

24. The apparatus of claim 23, further comprising means for puncturing pulses based on the pulse puncturing rate.

25. The apparatus of claim 23, wherein the receiving means is adapted to operate in different power modes based on the pulse puncturing rate.

26. The apparatus of claim 23, further comprising means for transmitting information related to the pulse puncturing rate to the communication device.

27. The apparatus of claim 23, wherein the receiving means comprises means for performing a Viterbi decoding and convolutional encoding based on the initial pulses.

28. The apparatus of claim 23, wherein the receiving means comprises means for performing a Viterbi decoding, Reed-Solomon decoding, Reed-Solomon encoding operation, and convolutional encoding based on the initial pulses.

29. The apparatus of claim 23, wherein the receiving means comprises:
means for substantially squaring the initial pulses to generate a first signal;
means for filtering the first signal to generate a second signal; and
means for slicing the second signal to generate a third signal from which the pulse puncturing rate is determined.

30. The apparatus of claim 23, wherein the pulse puncturing rate determining means comprises means for performing a table look up or an equation operation using information related to the initial pulses.

31. The apparatus of claim 23, wherein the pulse puncturing rate determining means comprises means for selecting a number of the pulses used in determining the pulse puncturing rate to achieve a defined resolution for the pulse puncturing rate or a defined processing time for determining the pulse puncturing rate.

32. The apparatus of claim 23, wherein the pulse puncturing rate determining means is adapted to continually update the pulse puncturing rate based on successive pulses.

33. The apparatus of claim 32, wherein the pulse puncturing rate determining means comprises means for selecting a number of successive pulses used in determining a new pulse puncturing rate to achieve a defined resolution for the new pulse puncturing rate or a defined processing time for determining the new pulse puncturing rate.

34. A computer program product for data communications comprising a computer readable storage medium encoded with codes executable by at least one processor to:
determine a pulse puncturing rate, wherein the pulse puncturing rate is determined by at least:
receiving information related to initial pulses;
determining one or more characteristics based on the information related to the initial pulses; and
determining the pulse puncturing rate based on the one or more characteristics, wherein the one or more characteristics comprise at least one of a symbol error rate or a symbol erasure rate; and
receive pulses from a communication device by way of a wireless communication channel based on the pulse puncturing rate.

35. A headset, comprising:
a first module adapted to determine a pulse puncturing rate, wherein the first module is adapted to determine the pulse puncturing rate by at least:
receiving information related to initial pulses;
determining one or more characteristics based on the information related to the initial pulses; and
determining the pulse puncturing rate based on the one or more characteristics, wherein the one or more characteristics comprise at least one of a symbol error rate or a symbol erasure rate;
a second module adapted to receive pulses from a communication device by way of a wireless communication channel based on the pulse puncturing rate; and
a transducer adapted to generate sound based on the received pulses.

36. A watch, comprising:
a first module adapted to determine a pulse puncturing rate, wherein the first module is adapted to determine the pulse puncturing rate by at least:
receiving information related to initial pulses;
determining one or more characteristics based on the information related to the initial pulses; and
determining the pulse puncturing rate based on the one or more characteristics, wherein the one or more characteristics comprise at least one of a symbol error rate or a symbol erasure rate;
a second module adapted to receive pulses from a communication device by way of a wireless communication channel based on the pulse puncturing rate; and
a user interface adapted to generate a user indication based on the received pulses.

37. A sensing device, comprising:
a first module adapted to determine a pulse puncturing rate, wherein the first module is adapted to determine the pulse puncturing rate by at least:
receiving information related to initial pulses;
determining one or more characteristics based on the information related to the initial pulses; and
determining the pulse puncturing rate based on the one or more characteristics, wherein the one or more characteristics comprise at least one of a symbol error rate or a symbol erasure rate;
a second module adapted to receive pulses from a communication device by way of a wireless communication channel based on the pulse puncturing rate; and
a sensor adapted to generate sensing data in response to or based on the received pulses.

38. A method of data communication, comprising:
transmitting a first set of pulses to a communication device by way of a wireless communication channel;
receiving information related to a pulse puncturing rate based on the first set of pulses from the communication device by way of the wireless communication channel, wherein the information related to the pulse puncturing rate comprises at least one of a symbol error rate or a symbol erasure rate; and
transmitting a subset of a second set of pulses based on the pulse puncturing rate information to a communication device by way of a wireless communication channel.

39. The method of claim 38, wherein the first or second set of pulses is modulated based on received data.

40. The method of claim 38, wherein the second set of pulses is based on a pulse puncturing rate substantially equal to zero (0).

41. The method of claim 38, further comprising verifying or modifying the pulse puncturing rate before transmitting the subset of the second set of pulses.

42. An apparatus for data communication, comprising:
a transmitter adapted to transmit a first set of pulses and a subset of a second set of pulses to a communication device by way of a wireless communication channel; and
a receiver adapted to receive information related to a pulse puncturing rate based on the first set of pulses from the communication device by way of the wireless communication channel, wherein the subset of the second set of pulses is based on the puncturing rate information, and wherein the information related to the pulse puncturing rate comprises at least one of a symbol error rate or a symbol erasure rate.

43. The apparatus of claim 42, further comprising a modulator adapted to modulate the first or second set of pulses based on received data.

44. The apparatus of claim 42, wherein the second set of pulses is based on a pulse puncturing rate substantially equal to zero (0).

45. The apparatus of claim 42, further comprising a module adapted to verify or modify the pulse puncturing rate.

46. An apparatus for data communication, comprising:
means for transmitting a first set of pulses and a subset of a second set of pulses to a communication device by way of a wireless communication channel; and
means for receiving information related to a pulse puncturing rate based on the first set of pulses from the communication device by way of the wireless communication channel, wherein the subset of the second set of pulses is based on the pulse puncturing rate information, and wherein the information related to the pulse puncturing rate comprises at least one of a symbol error rate or a symbol erasure rate.

47. The apparatus of claim 46, further comprising means for modulating the first or second set of pulses based on received data.

48. The apparatus of claim 46, wherein the second set of pulses is based on a pulse puncturing rate substantially equal to zero (0).

49. The apparatus of claim 46, further comprising means for verifying or modifying the pulse puncturing rate.

50. A computer program product for data communications comprising a computer readable storage medium encoded with codes executable by at least one processor to:
transmit a first set of pulses to a communication device by way of a wireless communication channel;
receive information related to a pulse puncturing rate based on the first set of pulses from the communication device by way of the wireless communication channel, wherein the information related to the pulse puncturing rate comprises at least one of a symbol error rate or a symbol erasure rate; and
transmit a subset of a second set of pulses based on the pulse puncturing rate information to the communication device by way of the wireless communication channel.

51. A headset, comprising:
a first module adapted to transmit a first set of pulses and a subset of a second set of pulses to a communication device by way of a wireless communication channel;
a second module adapted to receive information related to a pulse puncturing rate based on the first set of pulses from the communication device by way of the wireless communication channel, wherein the subset of the second set of pulses is based on the puncturing rate information, and wherein the information related to the pulse puncturing rate comprises at least one of a symbol error rate or a symbol erasure rate; and
a transducer adapted to generate audio data, wherein the subset of the second set of pulses is modulated based on the audio data.

52. A watch, comprising:
a first module adapted to transmit a first set of pulses and a subset of a second set of pulses to a communication device by way of a wireless communication channel;
a second module adapted to receive information related to a pulse puncturing rate based on the first set of pulses from the communication device by way of the wireless communication channel, wherein the subset of the second set of pulses is based on the puncturing rate information, and wherein the information related to the pulse puncturing rate comprises at least one of a symbol error rate or a symbol erasure rate; and
a user interface adapted to generate data, wherein the subset of the second set of pulses is modulated based on the data.

53. A sensing device, comprising:
a first module adapted to transmit a first set of pulses and a subset of a second set of pulses to a communication device by way of a wireless communication channel;
a second module adapted to receive information related to a pulse puncturing rate based on the first set of pulses from the communication device by way of the wireless communication channel, wherein the subset of the second set of pulses is based on the puncturing rate information, and wherein the information related to the pulse puncturing rate comprises at least one of a symbol error rate or a symbol erasure rate; and
a sensor adapted to generate sensing data, wherein the subset of the second set of pulses is modulated based on the sensing data.

* * * * *